United States Patent
Zhu et al.

(10) Patent No.: US 10,739,886 B2
(45) Date of Patent: Aug. 11, 2020

(54) TOUCH PANEL AND TOUCH DISPLAY DEVICE

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Jiang Zhu, Beijing (CN); Tongmin Liu, Beijing (CN); Hongchao He, Beijing (CN); Site Cai, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 15/758,334

(22) PCT Filed: Sep. 12, 2017

(86) PCT No.: PCT/CN2017/101329
§ 371 (c)(1),
(2) Date: Mar. 7, 2018

(87) PCT Pub. No.: WO2018/129945
PCT Pub. Date: Jul. 19, 2018

(65) Prior Publication Data
US 2019/0369782 A1 Dec. 5, 2019

(30) Foreign Application Priority Data
Jan. 16, 2017 (CN) .......................... 2017 1 0029133

(51) Int. Cl.
*G06F 3/041* (2006.01)
*G02F 1/1333* (2006.01)
(Continued)

(52) U.S. Cl.
CPC ........ *G06F 3/0412* (2013.01); *G02F 1/13338* (2013.01); *G06F 3/044* (2013.01); *H05K 3/328* (2013.01)

(58) Field of Classification Search
CPC ........ G06F 3/033; G06F 3/0412; G06F 3/044; G02F 1/13338; H05K 3/328
See application file for complete search history.

(56) References Cited

U.S. PATENT DOCUMENTS

| 8,118,611 B2 * | 2/2012 | Jeon ..................... H01R 12/523 439/511 |
| 2002/0089492 A1 * | 7/2002 | Ahn ..................... G02F 1/13338 345/173 |

(Continued)

FOREIGN PATENT DOCUMENTS

| CN | 101169695 A | 4/2008 |
| CN | 101452128 A | 6/2009 |

(Continued)

OTHER PUBLICATIONS

Office Action received for Chinese Patent Application No. 201710029133.5, dated Feb. 5, 2018, 12 pages (6 pages of English Translation and 6 pages of Office Action).

(Continued)

*Primary Examiner* — Amare Mengistu
*Assistant Examiner* — Crystal Mathews
(74) *Attorney, Agent, or Firm* — Womble Bond Dickinson (US) LLP

(57) ABSTRACT

The present disclosure provides a touch panel and a touch display device, in which the touch panel includes a printed circuit board on which a connecting portion is provided and a touch module including a to-be-connected area for connecting with the printed circuit board. The to-be-connected area is provided with a metal film layer therein. The to-be-connected area of the touch module is press fitted with the (Continued)

printed circuit board, and the connecting portion of the printed circuit board is configured to: when the to-be-connected area of the touch module is press fitted with the printed circuit board, the connecting portion is in contact with the metal film layer. The touch panel of the present disclosure has the advantages that the manufacture process can be simplified, the manufacture time and the manufacture and maintenance costs can be saved.

14 Claims, 3 Drawing Sheets

(51) Int. Cl.
*G06F 3/044* (2006.01)
*H05K 3/32* (2006.01)

(56) References Cited

U.S. PATENT DOCUMENTS

| | | | | |
|---|---|---|---|---|
| 2008/0157680 | A1* | 7/2008 | Tominaga | H05K 3/32 315/112 |
| 2008/0246744 | A1* | 10/2008 | Park | G06F 3/0416 345/173 |
| 2010/0079356 | A1* | 4/2010 | Hoellwarth | G02B 27/017 345/8 |
| 2010/0295800 | A1* | 11/2010 | Kuo | G02F 1/13452 345/173 |
| 2011/0036627 | A1* | 2/2011 | Loibl | H01R 43/0221 174/549 |
| 2011/0074729 | A1* | 3/2011 | Im | G06F 3/0412 345/174 |
| 2011/0095999 | A1* | 4/2011 | Hayton | G06F 1/1626 345/173 |
| 2012/0319967 | A1* | 12/2012 | Tsai | G06F 1/1626 345/173 |
| 2017/0075451 | A1* | 3/2017 | Wang | G06F 3/044 |
| 2017/0205928 | A1* | 7/2017 | Noguchi | G06F 3/0416 |
| 2017/0256902 | A1* | 9/2017 | Otto | H01R 43/205 |
| 2017/0316901 | A1* | 11/2017 | Sawada | G06F 3/0416 |
| 2017/0322659 | A1* | 11/2017 | Hu | G06F 1/1626 |
| 2018/0046267 | A1* | 2/2018 | Kobayashi | G06F 3/023 |
| 2019/0095000 | A1* | 3/2019 | Huang | G06F 3/044 |

FOREIGN PATENT DOCUMENTS

| | | |
|---|---|---|
| CN | 201927012 U | 8/2011 |
| CN | 102880350 A | 1/2013 |
| CN | 103336601 A | 10/2013 |
| CN | 106155398 A | 11/2016 |
| CN | 106775120 A | 5/2017 |

OTHER PUBLICATIONS

International Search Report received for PCT Patent Application No. PCT/CN2017/101329, dated Dec. 19, 2017, 7 pages (2 pages of English Translation and 5 pages of Original Document).

* cited by examiner

TOUCH PANEL AND TOUCH DISPLAY DEVICE

RELATED APPLICATION

This application claims the benefit of priority to Chinese Patent Application No. 201710029133.5, filed on Jan. 16, 2017, the entire content of which is incorporated herein by reference.

FIELD OF THE DISCLOSURE

The disclosure relates to the technical field of display, in particular to a touch panel and a touch display device.

BACKGROUND OF THE DISCLOSURE

With the increasing demand for information, people also put forward higher requirements on information display technology. At present, the commonly used display method on the market is liquid crystal display. The liquid crystal display uses an electric field to control the liquid crystal to rotate in order to achieve gray display, and uses a color filter to realize color display. It has the advantages of thinness, light weight, low power consumption and the like and it has been applied to the displays of computers, TVs and mobile terminals. In order to better achieve the function of human-computer interaction, the touch screen emerges as the times require. Currently, the widely used touch technology in the market is the transmissive capacitive touch technology.

In existing touch panels, different FPCs (Flexible Printed Circuits) are generally used to establish connection between the touch module and the master Printed Circuit Board (PCB) and between the display module and the master PCB. Specifically, taking the connection between the touch control module and the master PCB as an example, the following description is given: the touch control module and the display module are bonded together, and one end of the FPC is bonded to the touch control module that has been bonded to the display module, the other end of the FPC is plugged in the connector on the PCB.

The existing touch panel has the following defects:

1. The PCB and the control module are bonded by FPC, wherein on the one hand, ACF (anisotropic conductive adhesive film) needs to be used in the bonding process, which leads to an increase in the material cost; on the other hand, the FPC needs a manufacturing cycle and the bonding process is a time-consuming, complicated process;

2. The PCB and the control module are connected by using FPC, wherein in the bonding process, it needs to adjust the relative position between the FPC and the PCB, which leads to FPC bending, thereby FPC is prone to fracture, causing open circuit;

3. After the display module and the touch module are bonded together, if the touch module is scrapped, the FPC needs to be removed in order to remove the touch module, thereby increasing the manufacture and maintenance costs of the touch display panel.

SUMMARY OF THE DISCLOSURE

In order to solve the above shortcomings in the prior art, the present disclosure provides a touch panel and a touch display device to solve the problems of high manufacturing and maintenance costs, long assembly time, complicated process and easy fracture of the FPC.

In order to solve the above technical problem, the present disclosure adopts the following technical solutions:

The present disclosure provides a touch panel, comprising: a printed circuit board on which a connecting portion is provided; and, a touch module including a to-be-connected area for connecting with the printed circuit board, wherein the to-be-connected area is provided with a metal film layer therein. The to-be-connected area of the touch module is press fitted with the printed circuit board, and the connecting portion of the printed circuit board is configured to: when the to-be-connected area of the touch module is press fitted with the printed circuit board, the connecting portion is in contact with the metal film layer.

According to an aspect of the present disclosure, the connecting portion is an elastic sheet, and the elastic sheet is elastically deformed when the touch-control module is press fitted with the printed circuit board.

According to an aspect of the present disclosure, the connecting portion comprises at least one connecting member, each connecting member comprises a first arcuate structure, wherein a top end of the first arcuate structure is in contact with the metal film layer of the control module, and two free ends of the first arcuate structure are fixedly connected with the printed circuit board.

According to one aspect of the present disclosure, the connecting portion comprises at least one connecting member, wherein each connecting member comprises at least one first arcuate structure and at least one second arcuate structure, and the first arcuate structure and the second arcuate structure have opposite convex directions and are connected with each other; the top end of the first arcuate structure is in contact with the metal film layer of the touch module, the free end of the first arcuate structure and the free end of the second arcuate structure are fixedly connected with the printed circuit board.

According to an aspect of the present disclosure, the connecting portion comprises a plurality of connecting members, and the plurality of connecting members are disposed parallel to each other and evenly.

According to an aspect of the present disclosure, the connecting portion is a non-elastic member and the non-elastic member has a plate shape, and the first surface of the non-elastic member is fixedly connected to the printed circuit board, the second surface of the connecting portion is in contact with the metal film layer of the touch module, and the second surface is disposed opposite to the first surface.

According to an aspect of the present disclosure, the connecting portion is welded with the printed circuit board.

According to an aspect of the present disclosure, a plug-in slot is provided in the printed circuit board, and a free end of the connecting part is inserted into the plug-in slot.

According to an aspect of the present disclosure, the touch panel further comprises a display module, and the touch module further comprises a bonding area for bonding with the display module.

The present disclosure further provides a touch display device, which includes the touch panel as described above.

The present disclosure can achieve the following technical effects: in the touch panel and the touch display device provided by the present disclosure, a connecting portion is provided on a printed circuit board at a position corresponding to a metal film layer in a to-be-connected area of the touch module so that the printed circuit board and the to-be-connected area of the touch module are press fitted to make the connecting portion directly contact with the metal film layer of the touch module so as to directly and electrically connect the printed circuit board and the control module; the present disclosure utilizes the gravity of the touch module itself to press fit the connecting portion, realizing direct connection between the printed circuit board and the touch module without using the FPC to bond the printed circuit board and the touch module so as to solve the problem that the flexible printed circuit board is easy to fracture. Correspondingly, without using ACF, the manufacture process can be simplified, time and manufacturing cost can be saved. When the touch module needs to be reworked, it only needs to remove the touch module from the printed circuit board, without affecting the subsequent use of the printed circuit board, and improving the reworkability of the touch display panel.

BRIEF DESCRIPTION OF THE DRAWINGS

FIG. 3a is a schematic structural view of a touch panel including the connecting portion of FIG. 2a;

DETAILED DESCRIPTION OF THE DISCLOSURE

The technical solutions of the present disclosure will be specifically described below with reference to the accompanying drawings of the present disclosure. Obviously, the described embodiments are only a part but not all of the embodiments of the present disclosure. All other embodiments obtained by persons of ordinary skill in the art based on the embodiments of the present disclosure without creative efforts shall fall within the protection scope of the present disclosure.

Figure 1A:
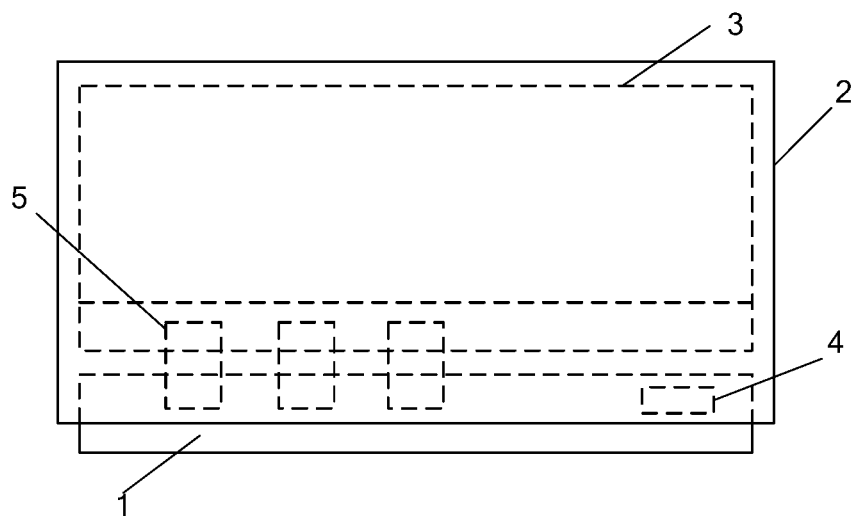
FIG. 1a is a top view of a touch panel provided by the present disclosure.
Figure 1B:
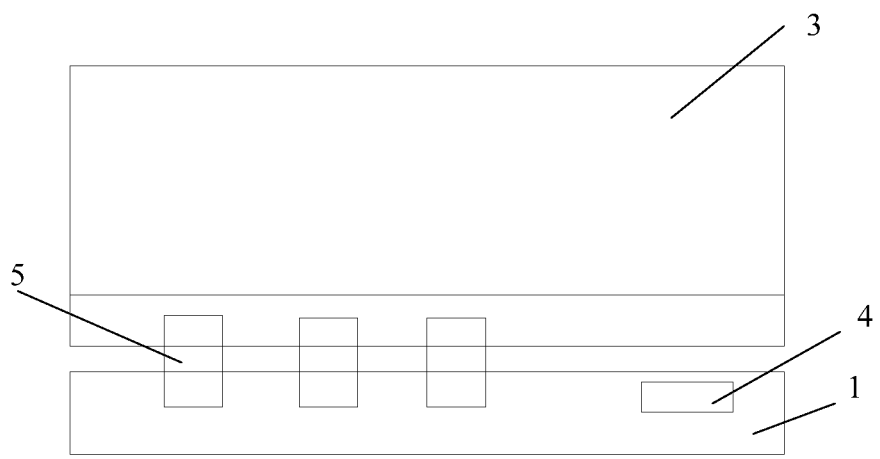
FIG. 1b is a schematic view of the connection between the display module and the printed circuit board according to the present disclosure.
Figure 1C:
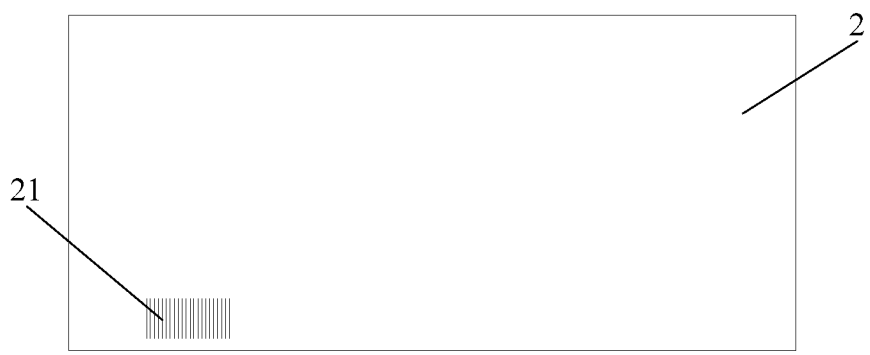
FIG. 1c is a schematic view of the surface where the to-be-connected area of the touch module is located according to the present disclosure.

As shown in FIG. 1a, FIG. 1b and FIG. 1c, the touch panel provided by the present disclosure includes a printed circuit board 1, a touch module 2 and a display module 3. The display module 3 and the printed circuit board 1 are connected by a plurality of flexible printed circuit boards (FPCs) 5 to achieve electrical connection. The lower surface of the touch module 2 (i.e., the surface where the to-be-connected area is located) can be divided into a to-be-connected area for press fitting with the printed circuit board 1 and a bonding area for bonding to the display module 3. A metal film layer 21 is disposed in the to-be-connected area of the touch module 2. As shown in FIG. 1c, the metal film layer 21 on the touch module 2 includes a plurality of metal wires. The touch panel further includes a connecting portion 4 for electrically connecting the printed circuit board 1 and the touch module 2. The connecting portion 4 is disposed on the printed circuit board 1 and is in contact with the metal film layer 21 of the touch module 2.

The touch module 2 is located above the display module 3, and the touch module 2 and the display module 3 are bonded together through a glue layer. The size of the touch module 2 is larger than the size of the display module 3, and the area on the touch module 2 for bonding with the display module 3 is the bonding area, and the area on the touch module 2 not bonded to the display module 3 is the to-be-connected area for connecting with the printed circuit board 1. The metal film layer 21 is located in the to-be-connected area of the surface of the touch module 2 facing the printed circuit board 1. That is, the metal film layer 21 is located on the lower surface of the touch module 2. The connecting portion 4 is disposed on the upper surface of the printed circuit board 1 at a position corresponding to the position of the metal film layer 21 on the touch module 2. The to-be-connected area of the touch module 2 is press fitted with the printed circuit board 1, and the connecting portion 4 is in contact with the metal film layer 21 to achieve electrical connection between the touch module 2 and the printed circuit board 1.

It should be noted that, the touch module 2 can adopt a transmissive capacitive touch module, including: G/G (Cover glass+Sensor glass, that is, using two substrate glass, one of which has the touch panel function, the other used as a glass cover) touch mode, G/FF (Glass+Film+Film, the touch layer is made on a transparent flexible substrate, and then the substrate is bonded to the glass cover) touch mode, OGS (One Glass Solution, integration) touch mode, On-cell touch mode (i.e., the touch panel function is embedded between the color filter substrate and the polarizer), In-cell touch mode (the touch panel function is embedded in the liquid crystal pixels) and the like.

The display module 3 can adopt LCM (liquid crystal display module), OLED (organic light emitting diode) display module and the like.

In the control panel provided by the present disclosure, the connecting portion is provided on the printed circuit board, and the position of the connecting portion corresponds to the position of the metal film layer in the to-be-connected area of the touch module so that the printed circuit board and the to-be-connected area of the control module are press fitted in order that the connecting portion directly contacts with the metal film layer of the touch module, and then the printed circuit board and the touch module are directly electrically connected. The present disclosure utilizes the gravity of the touch module itself to press fit the connecting portion, realizing direct connection between the printed circuit board and the touch module without using the FPC to bond the printed circuit board and the touch module so as to solve the problem that the flexible printed circuit board is easy to fracture. Correspondingly, without using ACF, the manufacture process can be simplified, time and manufacturing cost can be saved. When the touch module needs to be reworked, it only needs to remove the touch module from the printed circuit board, without affecting the subsequent use of the printed circuit board, and reducing the service or replacement cost of the touch display panel.

The connection between the connecting portion 4 and the printed circuit board 1 can be done in many ways, and the connecting portion 4 and the printed circuit board 1 may be connected by welding or may be plug connection. In the case where the connecting portion 4 is plug connected to the printed circuit board 1, a plug-in slot is provided in the printed circuit board 1, and a free end of the connecting portion is inserted into the plug-in slot. The connecting method between the connecting portion 4 and the printed circuit board 1 will be described in detail later with reference to the specific structure of the connecting portion 4.

The specific structure of the connecting portion 4 will be described in detail below with reference to FIGS. 2a-3c.

Figure 2A:
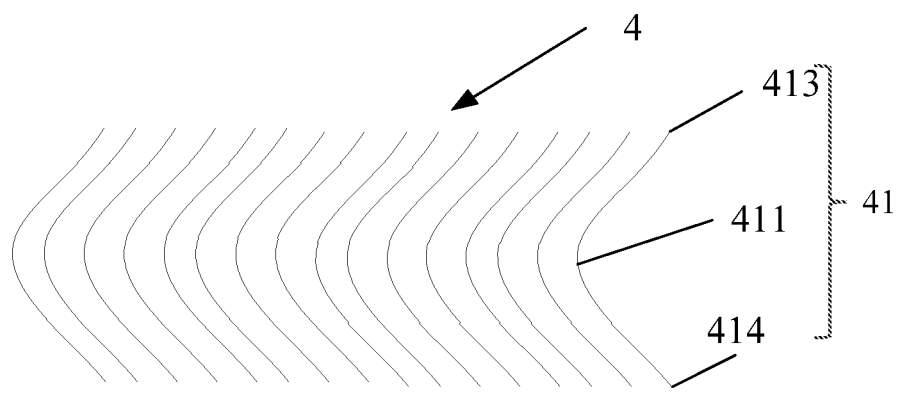
FIG. 2a is a first schematic structural view of the connecting portion provided by the present disclosure.
Figure 2B:
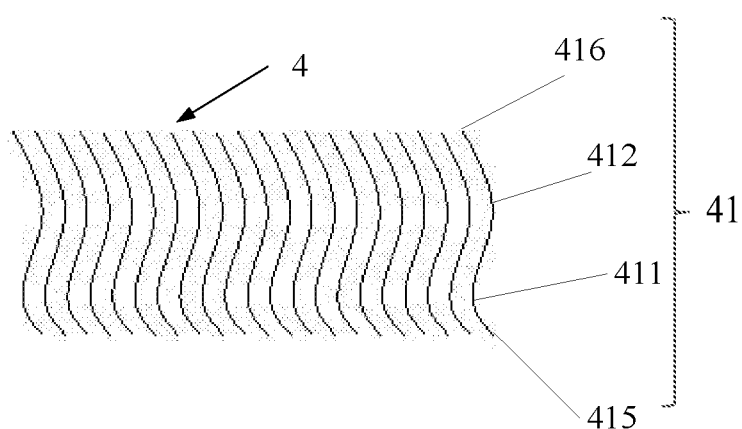
FIG. 2b is a second schematic structural view of the connecting portion provided by the present disclosure.
Figure 2C:
FIG. 2c is a third schematic structural view of the connecting portion provided by the present disclosure.

The connecting portion 4 may be an elastic structure or a non-elastic structure. FIGS. 2a and 2b show the specific structure of the connecting portion 4 of the elastic structure, and FIG. 2c shows the specific structure of the connecting portion 4 of the non-elastic structure.

Specifically, when the connecting portion 4 is an elastic structure, the connecting portion 4 can be an elastic sheet, and when the touch-control module 2 is press fitted onto the printed circuit board 1, the connecting portion 4 is elastically deformed.

By designing the connecting portion 4 as an elastic sheet structure, when the printed circuit board 1 is press fitted with the to-be-connected area of the control module 2, the connecting portion 4 is deformed between the metal film layer 21 of the touch module 2 and the printed circuit board 1 and is in contact with them. The elastic force generated by the elastic deformation of the connecting portion 4 can cause the connecting portion 4 and the metal film layer 21 to come into closer contact with each other, resulting in better contact effect and ensuring the stability of the electrical connection.

As shown in FIG. 2a and FIG. 2b, when the connecting portion 4 is an elastic structure, the connecting portion 4 may include one or more connecting members 41. In the corresponding embodiment of FIGS. 2a and 2b, the connecting portion 4 includes a plurality of connecting members 41, as an example. The connecting members 41 are independent of each other, arranged in parallel and evenly. It should be noted that each connecting member 41 corresponds to each metal wire of the metal film layer 21 one by one.

Figure 3A:
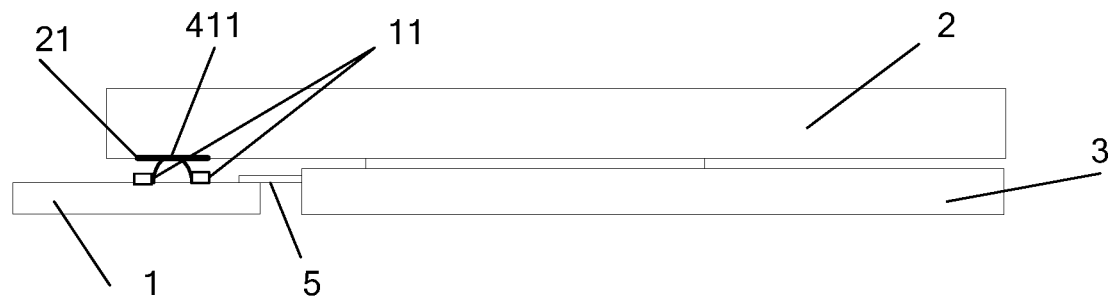

FIG. 2a shows a specific structure of the connecting portion 4, and FIG. 3a shows the structure of the touch panel including such connecting portion 4. As shown in FIG. 2a and FIG. 3a, the connecting portion 4 includes a plurality of connecting members 41 that are independent and parallel to each other. Each connecting member 41 includes a first arcuate structure 411. A top end of the first arcuate structure 411 is in contact with the metal film layer 21 of the touch module 2. The two free ends 413 and 414 of the first arcuate structure 411 are fixedly connected with the printed circuit board 1.

In the case that the connecting member 41 includes a first arcuate structure 411, the connecting member 41 and the printed circuit board 1 can be plug-connected. Specifically, as shown in FIGS. 2a and 3a, the printed circuit board 1 is provided with two plug-in slots 11. Two free ends 413 and 414 of each connecting member 41 are respectively inserted into two plug-in slots 11.

When the printed circuit board 1 is press fitted with the to-be-connected area of the control module 2, the first arcuate structure 411 of each connecting member 41 is elastically deformed. The elastic force generated thereby enables the top end of the first arcuate structure 411 is in close contact with the metal film layer 21.

Figure 3B:
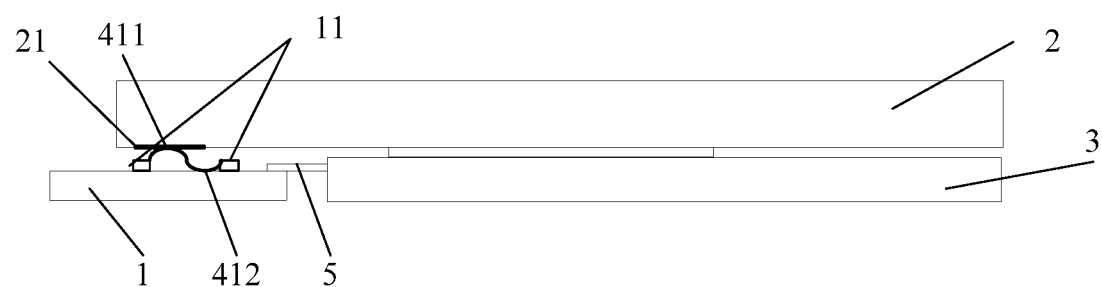
FIG. 3b is a schematic structural view of the touch panel including the connecting portion of FIG. 2b.

FIG. 2b shows another specific structure of the connecting portion 4, and FIG. 3b shows the structure of the touch panel including such connecting portion 4. As shown in FIG. 2b and FIG. 3b, the connecting portion 4 includes a plurality of connecting members 41 that are independent and parallel to each other. Each connecting member 41 includes at least one first arcuate structure 411 and at least one second arcuate structure 412. The convex directions of the first arcuate structure 411 and the second arcuate structure 412 are opposite to each other and the first arcuate structure 411 and the second arcuate structure 412 are connected to each other. The top end of the first arcuate structure 411 is in contact with the metal film layer 21 of the touch module 2 and the free end 415 of the first arcuate structures 411 and the free end 416 of the second arcuate structures 412 are fixedly connected to the printed circuit board 1. That is, the two free ends 415 and 416 of the entire connector 41 are fixedly connected to the printed circuit board 1 respectively. In the embodiment of the present disclosure, as shown in FIG. 2b, the connecting portion 4 includes a first arcuate structure 411 and a second arcuate structure 412, as an example. However, the connecting portion 4 may also include a plurality of first arcuate structures 411 and a plurality of second arcuate structures 412.

In the case that the connecting member 41 includes at least one first arcuate structure 411 and at least one second arcuate structure 412, the connecting member 41 can be plug-connected with the printed circuit board 1. Specifically, as shown in FIG. 2b and FIG. 3b, two plug-in slots 11 are provided in the printed circuit board 1. Two free ends 415 and 416 of each connecting member 41 are respectively inserted into the two plug-in slots 11.

When the printed circuit board 1 is press fitted with the to-be-connected area of the touch module 2, the first arcuate structure 411 and the second arcuate structure 412 of each connecting member 41 are elastically deformed, and the elastic force generated thereby enables the top end of the first arcuate structure 411 is in close contact with the metal film layer 21 and the contact effect is better, and the top end of the second arcuate structure 412 is in close contact with the printed circuit board 1, so that the printed circuit board 1 can provide the connecting member 41 a certain supporting force, so as to alleviate and slow the damage caused by the long-term compressive deformation of the first arcuate structure 411.

It should be noted that the connecting portion 4 of the elastic sheet structure is not limited to the foregoing structure including the plurality of connecting members 41, and the connecting portion 4 may also be an integral elastic sheet structure. For example, the connecting portion 4 may be in a bent shape and includes a first bend portion and a second bend portion. The first bend portion and the second bend portion are connected with each other and are arranged at an angle. The first bend portion can be fixedly connected with the printed circuit board 1 by welding or the like. When the printed circuit board 1 and the to-be-connected area of the touch module 2 are press fitted together, the second bend portion of the connecting portion 4 is elastically deformed, and the elastic force generated thereby brings the outer side of the second bend portion into close contact with the metal film layer 21.

Figure 3C:
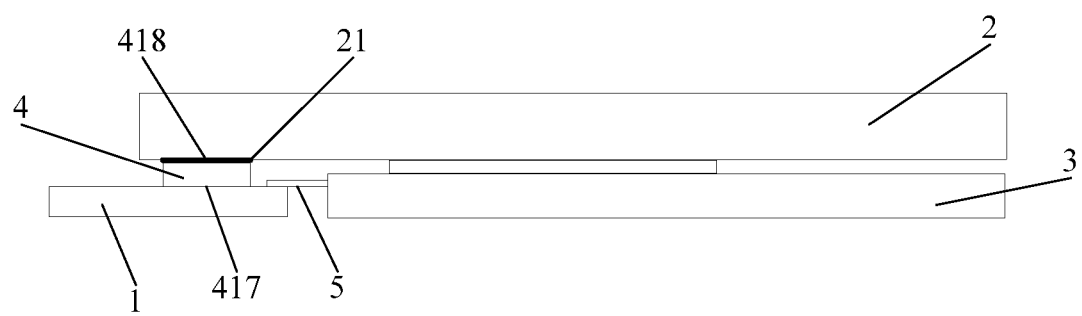
FIG. 3c is a schematic structural view of a touch panel including the connecting portion of FIG. 2c.

FIG. 2c shows a specific structure in which the connecting portion 4 is a non-elastic structure, and FIG. 3c shows the structure of a control panel including such a connecting portion 4. As shown in FIGS. 2c and 3c, the connecting portion 4 is a non-elastic member, and the connecting portion 4 is plate-shaped, the first surface 417 of the connecting portion 4 is fixedly connected to the printed circuit board 1, the second surface 418 of the connecting portion 4 is in contact with the metal film layer 21 of the touch module 2, and the second surface 418 is opposite to the first surface 417.

If the connecting portion 4 is plate-shaped, the connecting portion 4 and the printed circuit board 1 may be connected by welding.

The embodiment of the present disclosure further provides a touch display device, which includes the touch panel as described above.

The touch panel and the touch display device of the present disclosure can completely replace the connection mode of the FPC bonding and the plug connection between the touch module and the printed circuit board, which can effectively reduce the material and process costs, shorten the process cycle, and fundamentally solve the shortcomings caused by the FPC fracture and other adverse issues. When the touch module needs repair or replacement, the touch module is simply removed from the printed circuit board, without affecting the subsequent use of the printed circuit board, reducing repair or replacement costs of the touch panel.

It can be understood that the above embodiments are merely exemplary embodiments used for illustrating the principle of the present disclosure, but the disclosure is not limited thereto. For those skilled in the art, various modifications and improvements may be made without departing from the spirit and essence of the present disclosure, and these variations and improvements are also considered as within the protection scope of the present disclosure.

The invention claimed is:

1. A touch panel, comprising:
a printed circuit board on which a connecting portion is provided; and
a touch component comprising a to-be-connected area for connecting with the printed circuit board, wherein the to-be-connected area is provided with a metal film layer therein,
wherein the to-be-connected area of the touch component is press fitted with the printed circuit board, and the connecting portion of the printed circuit board is configured to: when the to-be-connected area of the touch component is press fitted with the printed circuit board, the connecting portion is in contact with the metal film layer, and
wherein the connecting portion is an elastic sheet, and the elastic sheet is elastically deformed when the touch component is press fitted with the printed circuit board.

2. The touch panel according to claim 1, wherein the connecting portion comprises at least one connecting member, each connecting member comprises a first arcuate structure, wherein a top end of the first arcuate structure is in contact with the metal film layer of the touch component, and two free ends of the first arcuate structure are fixedly connected with the printed circuit board.

3. The touch panel according to claim 2, wherein the connecting portion comprises a plurality of connecting members, the plurality of connecting members are disposed parallel to each other and evenly.

4. The touch panel according to claim 2, wherein a plug-in slot is provided on the printed circuit board, and a free end of the connecting part is inserted into the plug-in slot.

5. The touch panel according to claim 2, wherein the touch panel further comprises a display component, and the touch component further comprises a bonding area for bonding with the display component.

6. The touch panel according to claim 1, wherein the connecting portion comprises at least one connecting member, each connecting member comprises at least one first arcuate structure and at least one second arcuate structure, and the first arcuate structure and the second arcuate structure have opposite convex directions and are connected with each other;
a top end of the first arcuate structure is in contact with the metal film layer of the touch component, a free end of the first arcuate structure and a free end of the second arcuate structure are fixedly connected to the printed circuit board.

7. The touch panel according to claim 6, wherein the connecting portion comprises a plurality of connecting members, the plurality of connecting members are disposed parallel to each other and evenly.

8. The touch panel according to claim 6, wherein a plug-in slot is provided on the printed circuit board, and a free end of the connecting part is inserted into the plug-in slot.

9. The touch panel according to claim 6, wherein the touch panel further comprises a display component, and the touch component further comprises a bonding area for bonding with the display module.

10. The touch panel according to claim 1, wherein the connecting portion is welded with the printed circuit board.

11. The touch panel according to claim 1, wherein the touch panel further comprises a display component, and the touch component further comprises a bonding area for bonding with the display component.

12. A touch display device comprising a touch panel, the touch panel comprising:
a printed circuit board on which a connecting portion is provided; and
a touch component comprising a to-be-connected area for connecting with the printed circuit board, wherein the to-be-connected area is provided with a metal film layer therein,
wherein the to-be-connected area of the touch component is press fitted with the printed circuit board, and the connecting portion of the printed circuit board is configured to: when the to-be-connected area of the touch component is press fitted with the printed circuit board, the connecting portion is in contact with the metal film layer, and
wherein the connecting portion is an elastic sheet, and the elastic sheet is elastically deformed when the touch component is press fitted with the printed circuit board.

13. The touch display device according to claim 12, wherein the connecting portion comprises at least one connecting member, each connecting member comprises a first arcuate structure, wherein a top end of the first arcuate structure is in contact with the metal film layer of the touch component, and two free ends of the first arcuate structure are fixedly connected with the printed circuit board.

14. The touch display device according to claim 13, wherein the connecting portion comprises at least one connecting member, each connecting member comprises a first arcuate structure, wherein a top end of the first arcuate structure is in contact with the metal film layer of the touch component, and two free ends of the first arcuate structure are fixedly connected with the printed circuit board.

* * * * *